(12) United States Patent
Ghosh

(10) Patent No.: US 10,854,261 B1
(45) Date of Patent: Dec. 1, 2020

(54) EFFICIENT THERMALLY-ASSISTED SWITCHING

(71) Applicant: Vathys, Inc., Portland, OR (US)

(72) Inventor: Tapabrata Ghosh, Portland, OR (US)

(73) Assignee: Vathys, Inc., Portland, OR (US)

( * ) Notice: Subject to any disclaimer, the term of this patent is extended or adjusted under 35 U.S.C. 154(b) by 0 days.

(21) Appl. No.: 16/459,559

(22) Filed: Jul. 1, 2019

(51) Int. Cl.
*G11C 11/00* (2006.01)
*G11C 11/16* (2006.01)
*G06F 3/06* (2006.01)
*H01L 27/22* (2006.01)

(52) U.S. Cl.
CPC ........ *G11C 11/1675* (2013.01); *G06F 3/0611* (2013.01); *G06F 3/0653* (2013.01); *G06F 3/0659* (2013.01); *G06F 3/0673* (2013.01); *G11C 11/161* (2013.01); *G11C 11/1659* (2013.01); *H01L 27/228* (2013.01)

(58) Field of Classification Search
CPC ... G11C 11/00; G11C 11/1675; G11C 11/161; G06F 3/0611; G06F 3/0659; G06F 3/0673
USPC ......................................................... 365/158
See application file for complete search history.

(56) References Cited

U.S. PATENT DOCUMENTS

| | | | | |
|---|---|---|---|---|
| 6,778,429 B1 * | 8/2004 | Lu | ........................... | G11C 11/16 365/158 |
| 6,816,405 B1 * | 11/2004 | Lu | ........................... | G11C 11/16 365/158 |
| 2004/0240265 A1 * | 12/2004 | Lu | ........................... | G11C 11/16 365/171 |
| 2008/0272448 A1 * | 11/2008 | Dahmani | ............. | H01F 10/329 257/421 |

* cited by examiner

Primary Examiner — Harry W Byrne
(74) Attorney, Agent, or Firm — Cognition IP, P.C.; Edward Steakley

(57) ABSTRACT

Disclosed are systems and methods for improving the performance of magnetoresistive random access memory (MRAM). MRAM is one of the promising potential replacements for existing DRAM and SRAM memory devices due to the many advantages of the technology which include non-volatility, fast read and write speeds, improved read and write endurance, and low operating voltage. In one embodiment, the processing rates or other activity of circuits nearby an MRAM cell subject to write operations can be increased to increase the temperature of the MRAM cell. The increased temperature lowers the write field required during a write operation, which in turn lowers the power requirement and the switching time of the MRAM cell.

20 Claims, 3 Drawing Sheets

EFFICIENT THERMALLY-ASSISTED SWITCHING

BACKGROUND

Field of the Invention

This invention relates generally to the field of computer hardware and more particularly to efficient memory devices, used in computing devices.

Description of the Related Art

Memory technology continues to be both a key enabler and a barrier to rapid progress in all aspects of modern technology. Memory technology has historically lagged behind improvements in central processing unit (CPU) technology in terms of speed, size, and power consumption. This has been a limiting factor on the performance of computing systems. The improvement of memory technology is thus critical to the advancement of computer-related technology. Moore's Law, and recent improvements in circuit scaling, wire scaling, integrated circuits, and microprocessors technology along with emerging workloads such as machine learning workloads, artificial intelligence (AI) workloads, and the internet of things (IOT) workloads, have come to place even more importance on the improvement of memory technology.

An ideal memory technology would be nonvolatile (maintain its current state with no connection to power), small, scalable, exhibit low operating voltages, high switching speed, low power consumption, long retention time, high endurance, and cost effective to manufacture. Unfortunately, these characteristics can be difficult to achieve in one device technology and to date single solutions that optimally combine all these desired properties are rare or nonexistent.

Many memory technologies have been proposed in an attempt to improve on the current memory designs, such as dynamic random-access memory (DRAM) and static random-access memory (SRAM) designs. Some of these technologies include carbon nanotube (CNT) RAM, Ferroelectric RAM (FRAM), and phase-change memory. They promise to solve existing limitations of current technology. So far, these memory technologies can be difficult or expensive to manufacture. They can have problems with reliability in the field, or have other problems such as low storage density or poor cell endurance. A recently-developed type of memory referred to as magnetoresistive random-access-memory (MRAM) promises advancements in the field of memory technology. However, technical challenges hamper the wide-spread adoption of MRAM devices. Methods and techniques that can address the challenges facing MRAM technology are needed to provide advanced memory devices for use in modern applications.

SUMMARY

In one aspect of the invention a system is disclosed. The system includes: an MRAM structure, comprising a plurality of MRAM cells; a plurality of circuit elements, each configured to process one or more computing tasks at a processing rate; a controller configured to: determine MRAM cells subject to upcoming write operations; determine one or more circuit elements, in the plurality of circuit elements and within a volume of thermal effect relative to the MRAM cells subject to write operations; and increase processing rate of the one or more circuit elements within the volume of thermal effect.

In one embodiment, the volume of thermal effect comprises a volume surrounding the MRAM cells subject to upcoming write operations, wherein thermal response of circuit elements within the volume of thermal effect influences thermal response of the MRAM cells within the volume of thermal effect.

In another embodiment, the controller is further configured to increase the processing rate of the one or more circuit elements within the volume of thermal effect during write operations, or for a period of time starting before end of write operations, or from a predetermined period of time before end of write operations to a predetermined time after end of write operations.

In some embodiments, the controller is further configured to increase the processing rate, one or more time steps before end of the write operations, wherein the one or more time steps are determined at least partly based on a predetermined time period, a dynamically-determined time period, a stochastically-determined time period, or a combination thereof.

In one embodiment, the plurality of circuit elements comprise one or more of ALUs, control units, processor cores, registers, transistors, wire drivers, amplifiers, decoders, buses, gates, diodes, inverters and converters.

In some embodiments, the volume of thermal effect comprises a cube of dimension of approximately 500 micrometers per side and centered around the MRAM cells subject to upcoming write operations.

In another embodiment, the increase in processing rate is in an amount, such that thermal response of the one or more circuit elements within the volume of thermal effect, contributes to improving performance of write operations of the MRAM cells within the volume of thermal effect.

In some embodiments, the MRAM structure comprises two-terminal MRAM, three-terminal MRAM, STT-MRAM, SOT-MRAM, two-terminal STT-MRAM, two-terminal SOT-MRAM, three-terminal STT-MRAM and three-terminal SOT-MRAM.

In some embodiments, the MRAM cells are in a back-end-of-line (BEOL) metal layer and the one or more circuit elements within the volume of thermal effect comprise transistors in a layer underneath the BEOL layer.

In another embodiment, the MRAM structure is part of a three-dimensional integrated circuit and the one or more circuit elements within the volume of thermal effect comprise transistors located along a vertical axis relative to the MRAM cells within the volume of thermal effect.

In one embodiment, the system further includes: one or more microheaters within the volume of thermal effect and wherein the increase in processing rate is in an amount such that heat generated from the one or more microheaters and heat generated in the one or more circuit elements within the volume of thermal effect in combination improve write performance of the MRAM cells within the volume of thermal effect.

In another aspect of the invention, a method is disclosed. The method includes: determining MRAM cells subject to upcoming write operations; determining a volume of thermal effect relative to the MRAM cells subject to write operations; determining one or more circuit elements within the volume of thermal effect; and increasing processing rate of the one or more circuit elements within the volume of thermal effect.

In some embodiments, the volume of thermal effect comprises a volume surrounding the MRAM cells subject to upcoming write operations, wherein thermal response of circuit elements within the volume of thermal effect influences thermal response of the MRAM cells within the volume of thermal effect.

In some embodiments, increasing the processing rate of the one or more circuit elements within the volume of thermal effect occurs during write operations, or occurs for a period of time starting before end of write operations, or occurs from a predetermined period of time before end of write operations to a predetermined time after end of write operations.

In another embodiment, increasing the processing rate occurs one or more time steps before end of the write operations, wherein the one or more time steps are determined at least partly based on a predetermined time period, a dynamically-determined time period, a stochastically-determined time period, or a combination thereof.

In one embodiment, increasing processing rate is in an amount, such that thermal response of the one or more circuit elements within the volume of thermal effect, contributes to improving performance of write operations of the MRAM cells within the volume of thermal effect.

In one embodiment, the MRAM cells are part of an MRAM structure comprising two-terminal MRAM, three-terminal MRAM, STT-MRAM, SOT-MRAM, two-terminal STT-MRAM, two-terminal SOT-MRAM, three-terminal STT-MRAM and three-terminal SOT-MRAM.

In some embodiments, the MRAM cells are in a back-end-of-line (BEOL) metal layer and the one or more circuit elements within the volume of thermal effect comprise transistors in a layer underneath the BEOL layer.

In another embodiment, the MRAM cells are part of a three-dimensional integrated circuit and the one or more circuit elements within the volume of thermal effect comprise transistors positioned along a vertical axis relative to the MRAM cells within the volume of thermal effect.

In one embodiment, the method further includes operating one or more microheaters within the volume of thermal effect and wherein the increase in processing rate is in an amount such that heat generated from the one or more microheaters and heat generated in the one or more circuit elements within the volume of thermal effect in combination improve write performance of MRAM cells within the volume of thermal effect.

BRIEF DESCRIPTION OF THE DRAWINGS

These drawings and the associated description herein are provided to illustrate specific embodiments of the invention and are not intended to be limiting.

DETAILED DESCRIPTION

Figure 1:
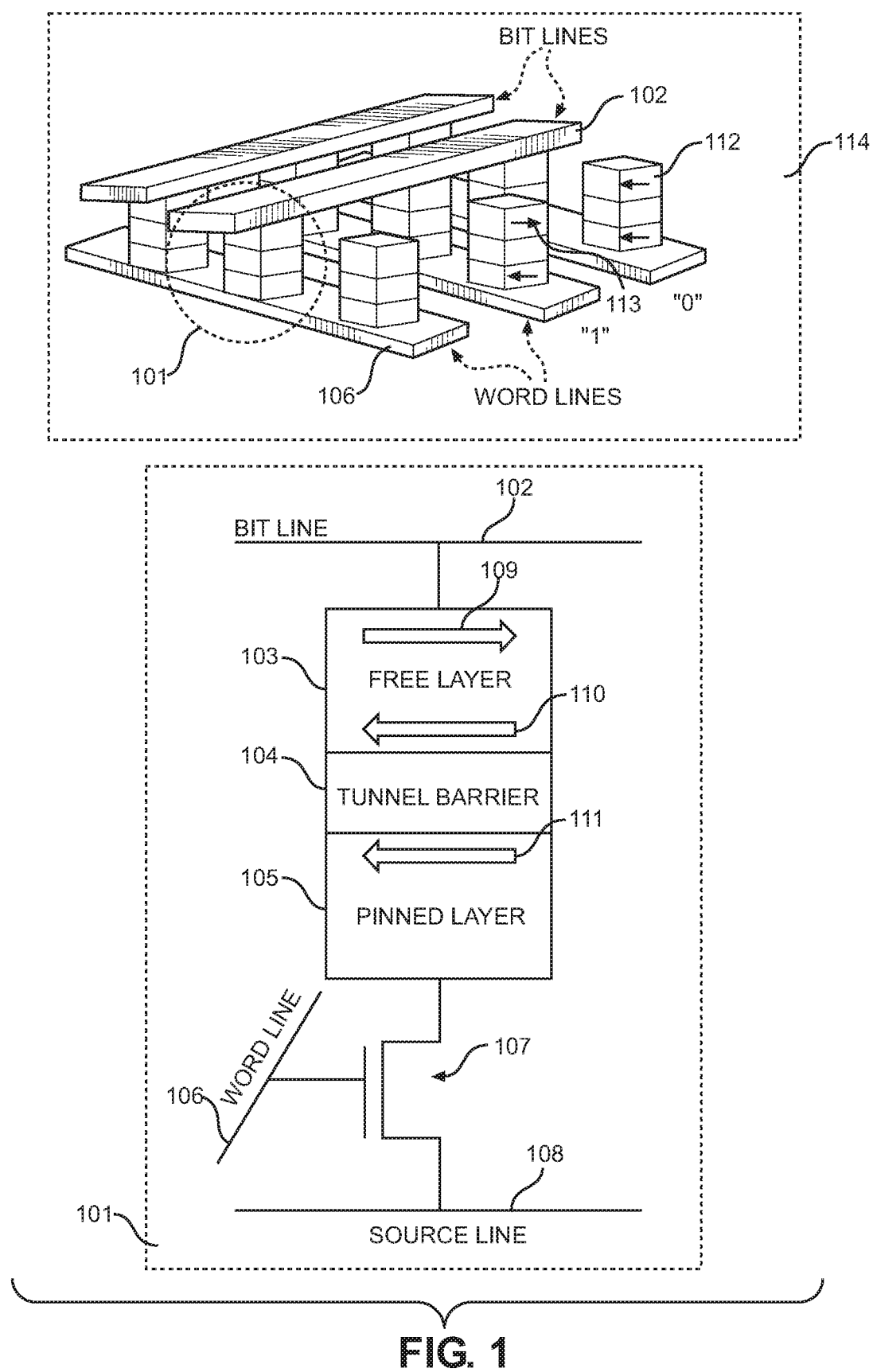
FIG. 1 illustrates an example MRAM device.

The following detailed description of certain embodiments presents various descriptions of specific embodiments of the invention. However, the invention can be embodied in a multitude of different ways as defined and covered by the claims. In this description, reference is made to the drawings where like reference numerals may indicate identical or functionally similar elements.

Unless defined otherwise, all terms used herein have the same meaning as are commonly understood by one of skill in the art to which this invention belongs. All patents, patent applications and publications referred to throughout the disclosure herein are incorporated by reference in their entirety. In the event that there is a plurality of definitions for a term herein, those in this section prevail. When the terms "one", "a" or "an" are used in the disclosure, they mean "at least one" or "one or more", unless otherwise indicated.

The term "thermal response" can refer to the thermal behavior of a component or element when heat is applied to or removed from the component.

Today's technology demands a massive amount of memory and CPU processing power. The Internet and AI applications alone are placing a burden on current CPU and memory technology. As the IOT connects billions of devices across the world, this trend will multiply. These technologies require memory. Memory technology is currently a primary limiting factor on the rapid expansion of these technologies. This can be observed by comparing CPU processing and transfer rates to those achievable by state-of-the-art memory technologies. Memory technologies have not followed Moore's Law and thus have lagged behind CPU advancements. For instance, according to some studies, between the years 1980 and 2000, CPU performance grew at approximately 60% per year while DRAM speeds improved at less than 10% per year over the same period (Carvalho, Carlos; "The Gap between Processor and Memory Speeds"; Proceedings of the International Conference on Computer Architecture, 2002, Braga, Portugal 2002). This trend has continued in recent years even though CPU speed improvements have slowed as we reach the limits of Moore's Law. In addition to speed, size, and power, other properties that are desirable for memory technology have not been fully realized in a single memory technology. These include non-volatility, scalability, long retention time, high endurance, and low manufacturing costs.

A recently developed memory structure, magnetoresistive random-access memory (MRAM), provides several technical advantages that make it an attractive potential to replace current memory types. Some attractive attributes of MRAMs are non-volatility, fast read and write speeds, read and write endurance, and low voltage requirements.

FIG. 1 illustrates an example MRAM device 114, which can include a plurality of MRAM cells 101. The MRAM class of solid-state storage circuits store data as nonvolatile magnetic states of magnetoresistive devices instead of electrical charge as used by DRAM. A device is magnetoresistive if it shows a change in electrical resistance in the presence of a magnetic field. The data from an MRAM device 114 can be read by measuring the resistance of the MRAM cells 101 to determine their magnetic state. A magnetic tunnel junction (MTJ) MRAM cell 101 can include a thin, for example around 1 nanometer (nm) insulating non-magnetic tunnel barrier layer 104, sandwiched between a free layer 103 and a pinned layer 105. This structure is referred to as an MTJ device because the thickness of the barrier layer 104 allows electrons to tunnel through it from one plate to another. The amount of tunneling is dependent on how the magnetic fields are oriented in the free layer, and the amount of tunneling changes the electrical resistance of the MTJ device. The free layer 103 and the pinned layer 105 are made from ferromagnetic material. The pinned layer 105 contains the reference magnetic direction 111 for the MRAM cell 101 and is designed to have magnetic anisotropy much higher than the free layer 103 so that pinned layer 105 does not switch during operation of the MRAM device 114. The free layer 103 may be written with an applied magnetics direction 109 or 110 depending on how current is applied along the bit line 102 and the word line 106. This type of writing can be referred to as Stoner-Wohlfarth-type field switching.

The source line 108 determines if the MRAM cell 101 will be read from or written to by switching the transistor 107 between on or off states, respectively. During a read operation, a bit value of 1 or 0 is read from the MRAM cell 101, depending on the resistivity through the tunnel barrier 104. The resistivity is higher when the magnetic direction of the free layer 103 opposes the magnetic direction of the pinned layer 105. The resistivity is lower when magnetic directions of the free layer 103 and the pinned layer 105 are parallel. A reference value is used to threshold these resistance values and assign a bit value of 1 or 0 for the read operation. A bit value of 1 is assigned to the higher resistivity case and 0 is assigned for the lower resistivity case. During a write operation, the transistor 107 is turned off and the currents in the bit lines 102 and word lines 106 create magnetic fields that will set the magnetic direction of the free layer 103. The bit lines 102 and word lines 106 may also be referred to as write lines. While there are many different methods for writing an MRAM device including Stoner-Wohlfarth-type field switching, Savtchenko switching, spin-torque transfer switching (STT-MRAM) and thermally-assisted switching, the read operation is typically based on measuring resistance.

A collection of MTJ MRAM cells 101 is shown in the MRAM device 114 to illustrate how multiple cells can be addressed and written by the bit lines 102 and the word lines 106 to compose a memory device. Examples of a bit value of 1 are represented at MRAM cell 113 and a value of 0 at MRAM cell 112. In the example shown, free layers of the MRAM cells 113 and 112 have opposite magnetic field directions, relative to one another.

The advantages of MRAM memory devices over existing memory technologies can include non-volatility, high switching speeds, high endurance, scalability, and little to no leakage power. Some of the disadvantages of MRAM devices can include poor stability at high frequencies, unstable data retention at high temperatures, poor write selectivity, and high-power requirement for write operations, compared to current-generation DRAM and SRAM technologies.

A number of techniques have been proposed to overcome the disadvantages of MRAM devices. These techniques include spin-transfer torque (STT-MRAM), voltage-controlled anisotropy (VCA), voltage-controlled magnetism (VCM), spin Hall effect (SHE), and spin-orbit torque switching (SOT-MRAM). There are various disadvantages to these techniques. For example, inability to simultaneously achieve low switching current, high thermal stability, and large tunneling magnetoresistance (TMR), known as the STT-MRAM trilemma, impacts the widespread adoption of STT-MRAM devices. Improving one or two of these properties can be at the expense of another desirable property of the device. The other techniques can be promising because they have the property of requiring little to no current through the MTJ device to achieve switching, but they can suffer from other technical challenges. Using VCA techniques, for instance, does not lead to deterministic switching between two stable states. SHE is not efficient at switching devices with perpendicular magnetization and SOT-MRAM demands new developments in materials to become practical.

Thermally-Assisted Switching

One of the drawbacks of standard MRAM is that it requires more power to write than current generation SRAMs due to the strong magnetic characteristics that result in high data retention and endurance. A recently developed technique known as thermally-assisted switching (TAS) has been proposed as a method to improve MRAM write performance. In TAS, the temperature of an MRAM cell or combination of cells to be written is temporarily raised during the write operation. The properties of magnetic material change with increasing temperature and the effect is to lower the magnetic field required to switch the magnetic state of the device. For instance, a ferromagnetic material has an ordered arrangement of magnetic moments that have the same magnitude and direction in the absence of an applied field. A permanent magnet is an example of this. If the magnetic material is heated beyond the Curie temperature of that material, the magnetic moments become disordered in the presence of no magnetic field and ordered in the presence of a magnetic field. This property is what allows the magnetic material to be written in a specific direction by an applied field. Current flowing through the write lines of the MRAM device generates the magnetic write field. Thus, lowering the write field required to write, also lowers the current required to write, and therefore the power required to write the device.

The temperature at which the switching of the magnetic direction in an MRAM cell can be achieved with lower power depends on the type and composition of the magnetic material used in the MRAM cell. In many types of magnetic material, this is known as the Curie temperature, while in the case of superparamagnetism this is referred to as the blocking temperature. In both cases, once a threshold temperature is reached, the properties of the magnetic material change in such a way as to lower the magnetic field required to switch the state of the device.

The approach of TAS in MRAM devices has several advantages over previous MRAM technologies. The write-selectivity problems associated with some write techniques, such as Stoner-Wohlfarth-type, can be minimized or eliminated because the write selection is temperature-dependent. Without TAS technology, the Stoner-Wolfarth-type writing methods can suffer from write selectivity because the field can be difficult to isolate properly and random writes in adjacent MRAM cells can occur. This also limits how small the write circuits can be made. By contrast, using the TAS technique, the write power is reduced because one magnetic field can be used to write instead of two (as the case maybe in other techniques not utilizing TAS) and also because the magnitude of the write field is lowered. Using TAS techniques, the time spent to write a cell is also reduced which decreases switching time.

Some TAS implementations for MRAM devices, use microheaters (e.g., an array of resistors) to modulate the temperature of MRAM cells in a desired direction. One of the drawbacks of this technique is that microheaters and associated circuitry can be large and consume a large amount of power. For some applications, the larger die size and higher power requirements make this type of MRAM solution less desirable.

Devices and methods that can reduce the power requirements and die area for a TAS MRAM device is desirable. Heat can be generated near an MRAM device, targeted for a writing operation, by selectively activating or increasing the activity of nearby circuit elements. Circuits that have current flowing through them generate heat as a byproduct. Using this heat in a selective manner to direct heat toward MRAM cells that are within a volume of thermal effect of the nearby circuits can enable improved writing operation within those MRAM cells, as described above. Nearby circuit elements, in addition to performing their underlying functionality, can function as heating elements for the TAS MRAM devices during write operations. This can reduce the die size and power requirements of the memory system.

Figure 2:
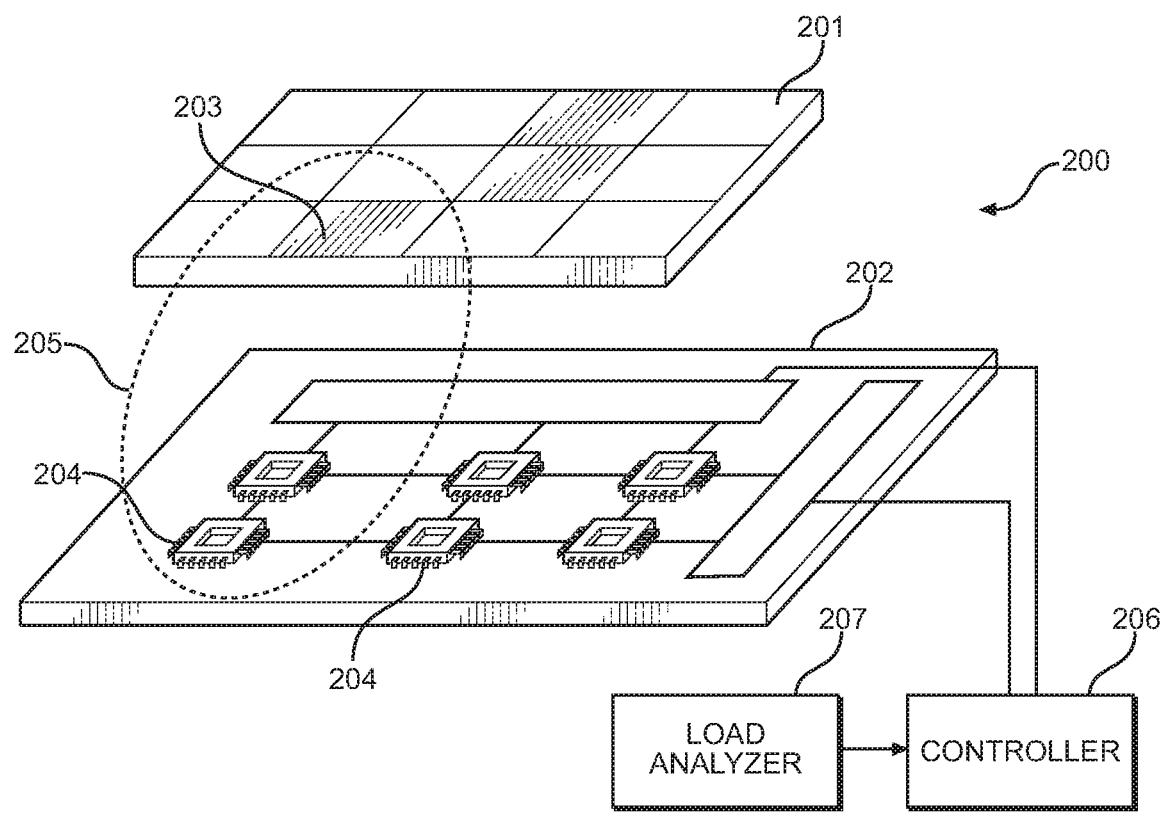
FIG. 2 illustrates an example memory system containing an MRAM structure and a circuit layer in close proximity to it.

FIG. 2 illustrates an example memory system 200 that contains an MRAM structure 201 and a circuit layer 202 in close proximity to it. The MRAM structure 201 can include a plurality of MRAM cells 203 and circuit layer 202 can include a plurality of circuit elements 204. Circuit elements 204 can include any type of circuit element such as transistors, processors, multi-core processors, arithmetic logic units (ALUs), control units, wire drivers, encoders, decoders, or other circuits which may exist in a computing system. A controller 206 can be configured to increase the processing rates of the circuit elements 204 within a volume of thermal effect 205 to generate heat to improve the write performance of the MRAM cells 203. The write performance improvement can include reduced power consumption for write operations, enhanced stability, and more precise selectivity of MRAM cells 203 during writing operations. Write selectivity refers to the ability to properly switch the desired cells, targeted for writing, while avoiding accidental writes in adjacent cells. TAS of MRAM devices of the disclosed embodiments can provide more precise selectivity by avoiding undesirable switching of cells that are not targeted for writing. In comparison, other MRAM technologies can suffer from poor write selectivity because a strong field required for their writing operations can unintentionally write adjacent cells and create data errors.

The volume of thermal effect 205 can refer to a three-dimensional region surrounding an MRAM cell 203 that can include a number of various circuit elements 204 that are within a distance to the MRAM cell 203 such that the thermal response of the circuit elements within the volume of thermal effect 205 can reach and influence the MRAM cell 203. A variety of techniques can be used to determine or predetermine the volume of thermal effect 205 for an RAM cell 203. For example, in some implementations, the volume of thermal effect 205 can be empirically determined. In one embodiment, the controller 206 can be configured to perform a series of writing and reading operations on one or more MRAM cells 203 while applying a matrix of processing rates to the nearby circuit elements. The quality of the writes and reads can then be measured, for instance, by error rate or other stress test like heat, to determine the volume of thermal effect 205. In other embodiments, a map of thermal response of circuit layer 202 can be generated based on various processing rates and types of circuit elements 204 in the circuit layer 202. For example, a controller 206 can be configured to run an initialization script including various test processing rates on circuit elements 204 of the circuit layer 202 to construct a map of the regions of thermal effect 205 for one or more MRAM cells 203.

The circuit elements 204 can be located in any combination of x, y, and z coordinates from an MRAM cell 203 and can be any type of circuit, used in computing systems, including ALUs, control units, processor cores, registers, transistors, wire drivers, amplifiers, decoders, buses, gates, diodes, inverters and converters. The circuit layer 202 is composed of circuit elements 204 that are configured to process one or more computing tasks at a processing rate that can be varied by the controller 206. During the layout phase of the memory system 200, various circuit elements 204 can be optimally located such as to further optimize the selectivity and efficiency of the heat transfer to improve the write performance in MRAM cells 203. For instance, during layout, heat maps could be generated, based on circuit elements 204 size and power requirements in simulations or calculations, and then utilized to distribute circuit elements 204 in a manner to optimize heat transfer to the MRAM cells 203.

The controller 206 can be configured to determine which MRAM cells 203 are subject to upcoming write operations; determine circuit elements 204, in the circuit layer 202 and within a volume of thermal effect 205 relative to those MRAM cells 203 and activate and/or increase the activity rate (e.g., the processing rate) of those circuit elements 204 within the volume of thermal effect 205. The increase in activity and/or processing rate in circuit elements 204 can generate heat near the MRAM cells 203 that are subject to write operations. As described earlier, this can improve the efficiency of the write operation by reducing write power and enabling faster write times. The controller 206 can be implemented using a micro-processor and memory, a field-programmable gate array, a cloud computer, or other circuit devices. The controller 206 can be configured to receive a signal from a load analyzer 207 indicating the MRAM cells 203 that are subject to an upcoming write operation. The load analyzer 207 can scan an upcoming processing workload and optimally schedule a series of write and/or read operations such that the write and/or read performance is optimized. The load analyzer 207 and the controller 206 can also be configured to identify circuit elements 204 whose processing rates can be increased during the upcoming write operations in order to improve the efficiency of those operations. The load analyzer 207 can be implemented in a combination of software and hardware in the controller 206 or separate from the controller 206. The load analyzer 207 can also exist on a cloud server that is scheduling operations across multiple storage devices or arrays, such as multiple instances of the MRAM system 300.

The controller 206 can be configured to modulate the processing rate of the circuit elements 204 within a volume of thermal effect 205 during a write operation. Further, the controller 206 can modulate the processing rate prior to the start or end of the write operation, during the write operation, and/or after the write operation has completed. The controller 206 can include software and hardware elements that facilitate this operation. As described, the layout of the circuit elements 204 and other components within the circuit layer 202 can be optimized in a manner to also facilitate efficient heat distribution during write operations. For instance, bus lines can be implemented that are near sets of circuit elements that fall along a write line in the MRAM structure 201.

The controller 206 can be configured to increase the processing rate of circuit elements 204, at least partly based on one or more time steps before end or start of the write operations, wherein the one or more time steps can be determined at least partly based on a predetermined time period, a dynamically-determined time period, a stochastically-determined time period, or a combination thereof. The time steps can be determined based on known physical characteristics of the circuit elements 204, such as the time and clock rate needed to reach a desired temperature and the time to recover to an ambient temperature after increasing the processing rate. The time steps can also be determined empirically through experimentation or through optimization algorithms. The optimization algorithms can include optimizing which circuit elements 204 to select for increasing activity rates, as well as how long and at what rate to clock those circuits and/or otherwise increase their activity rate. The targeted circuit elements 204 can also have a constant current applied for a time period rather than pulsing. The optimization algorithm can be implemented in a combination of hardware and software and can reside in the controller 206, the load analyzer 207, or in an external processor. The optimization can include optimizing for low power and/or faster write operations or other combinations.

The controller 206 can be configured to increase the processing rate of one or more circuit elements 204 by an amount such that the thermal response of the circuit elements 204, within a volume of thermal effect 205, can raise the temperature of a desired MRAM cell 203 in a way that can improve write performance in that cell. One method for determining the desired amount of increase in processing rate can include using an optimization algorithm that experimentally applies various processing rates and durations and measures performance characteristics such as error rate, power consumption rates, speed of write, write data retention or other characteristics as may be desired.

The techniques described can improve the write performance of many MRAM-based systems and are not dependent on a specific type of MRAM technology. Some of the MRAM structures that can benefit from the described technology include, two-terminal MRAM, three-terminal MRAM, STT-MRAM, SOT-MRAM, two-terminal STT-MRAM, two-terminal SOT-MRAM, three-terminal STT-MRAM and three-terminal SOT-MRAM.

As described earlier, device layout can provide opportunities for forming a desired volume of thermal effect 205 or vice versa. For example, in some devices, the MRAM cells 203 can be in a back-end-of-line (BEOL) metal layer. In those devices, the volume of thermal effect 205 can include transistors in a layer underneath the BEOL layer. Similarly, a device's topology, layout and design can be examined, regions of thermal effect determined and coded in the operations of the controller 206.

The MRAM structure 201 can be part of a three-dimensional integrated circuit and the one or more circuit elements 204 within the volume of thermal effect 205 can include transistors or other components positioned along a vertical axis relative to the MRAM cells 203. The described memory structures and methods of operating them can be integrated in various two or three-dimensional integrated circuits (ICs), including layered or stacked ICs, where a memory structure layer is vertically stacked on or amongst one or more processor and/or microprocessor layers, a substrate-chip layer, memory layer device, a set of assembled chip/substrate layered device, a wafer-scale integrated device and any other processor-memory system, where an MRAM structure can be used internally (as a highly integrated system) or externally as a memory servicing the processor.

In an embodiment, the MRAM structure 201 can be manufactured in proximity to one or more microheaters within the volume of thermal effect 205 in addition to other circuit elements 204 and wherein the increase in processing rate is in an amount such that heat generated from the one or more microheaters and heat generated in the one or more circuit elements 204 within the volume of thermal effect 205 improves the write performance of MRAM cells within the volume of thermal effect 205 via mechanisms described above.

Figure 3:
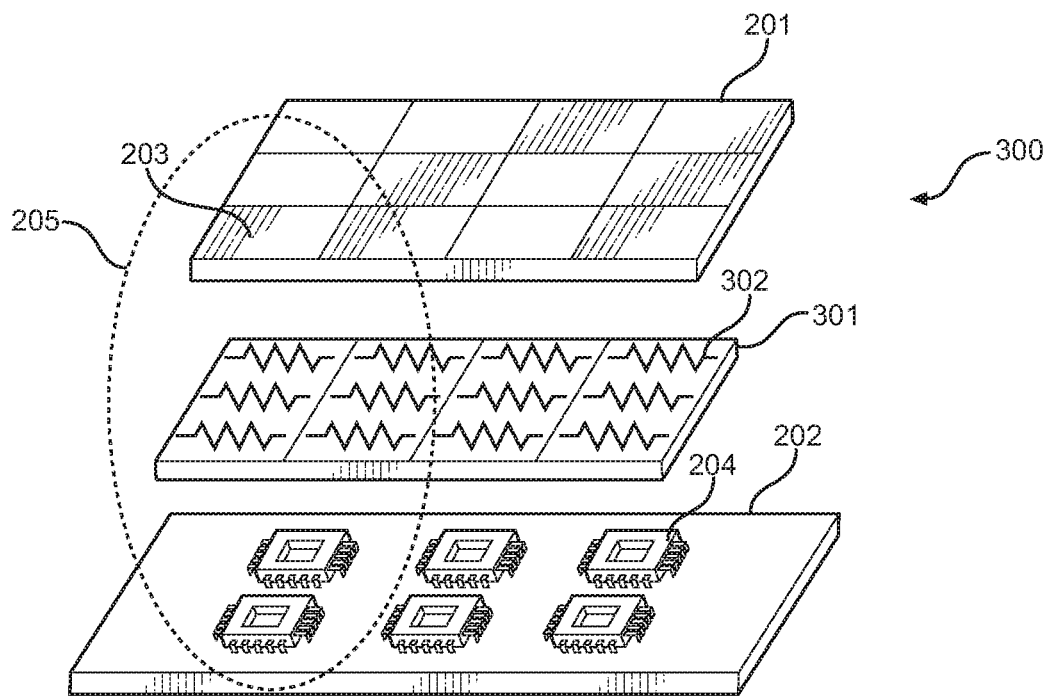
FIG. 3 illustrates an MRAM system utilizing a combination of circuit elements and microheaters.

FIG. 3 illustrates an embodiment of an MRAM system 300 utilizing a combination of the circuit layer 202 and a microheater layer 301. The circuit layer 202 can include one or more circuit elements 204 and the microheater layer 301 can include one or more microheaters 302. The processing rate of the circuit elements 204 from the circuit layer 202 and the applied currents to microheaters 302 within the volume of thermal effect 205 can be increased in order to create a desired thermal effect to improve the write process of the MRAM cells 203. While microheaters 302 are shown within a microheater layer 301, the microheaters 302 can be implemented within or as part of another layer, without a dedicated microheater layer 301, in order to conserve chip area.

One embodiment can place the microheaters in strategic locations where other circuit elements either do not generate enough heat transfer or in locations where no other circuit elements exist. Another embodiment can place the microheaters in an array to match locations of MRAM cells 203. The number and type of microheaters used is not limited, but it is envisioned that there would be fewer microheaters required than in a standard MRAM implementation where circuit elements 204 are not utilized for heat transfer or alternatively the power consumed by any number of deployed microheaters can be less than a standard MRAM implementation augmented with microheaters.

The microheaters 302 can be used to raise the temperature of their surrounding MRAM cells 203 up to but below a desired write temperature. Using the heat generated from the microheaters 302 can reduce the write power consumption drawn from circuit elements 204 within the volume of thermal effect 205 to reach the desired write temperature of the MRAM cells 203. Alternatively, the time to reach a desired write temperature of the MRAM cells 203 is reduced or minimized. This can enable faster write times and/or reduce power consumption. In another embodiment, the placement of microheaters 302 can be in a sparse array such that the microheaters 302 provide partial heating of some of their nearby MRAM cells 203 while the remaining nearby circuit elements 204 can provide more localized heating within the volume of thermal effect 205.

The volume of thermal effect 205 relative to an MRAM cell 203 in FIGS. 2 and 3 can include a three-dimensional space surrounding the MRAM cell 203, in various shapes and sizes. As an example, the volume of thermal effect 205 relative to an MRAM cell 203 can include a cube of dimension of approximately 500 micrometers (um) per side and centered around the MRAM cell 203. Other three-dimensional shapes, such as a sphere of diameter 500 um centered around the MRAM cell 203 can be envisioned. In some embodiments, the volume of thermal effect 205 can be a region of thermal effect including a two-dimensional area surrounding the MRAM cell 203.

Figure 4:
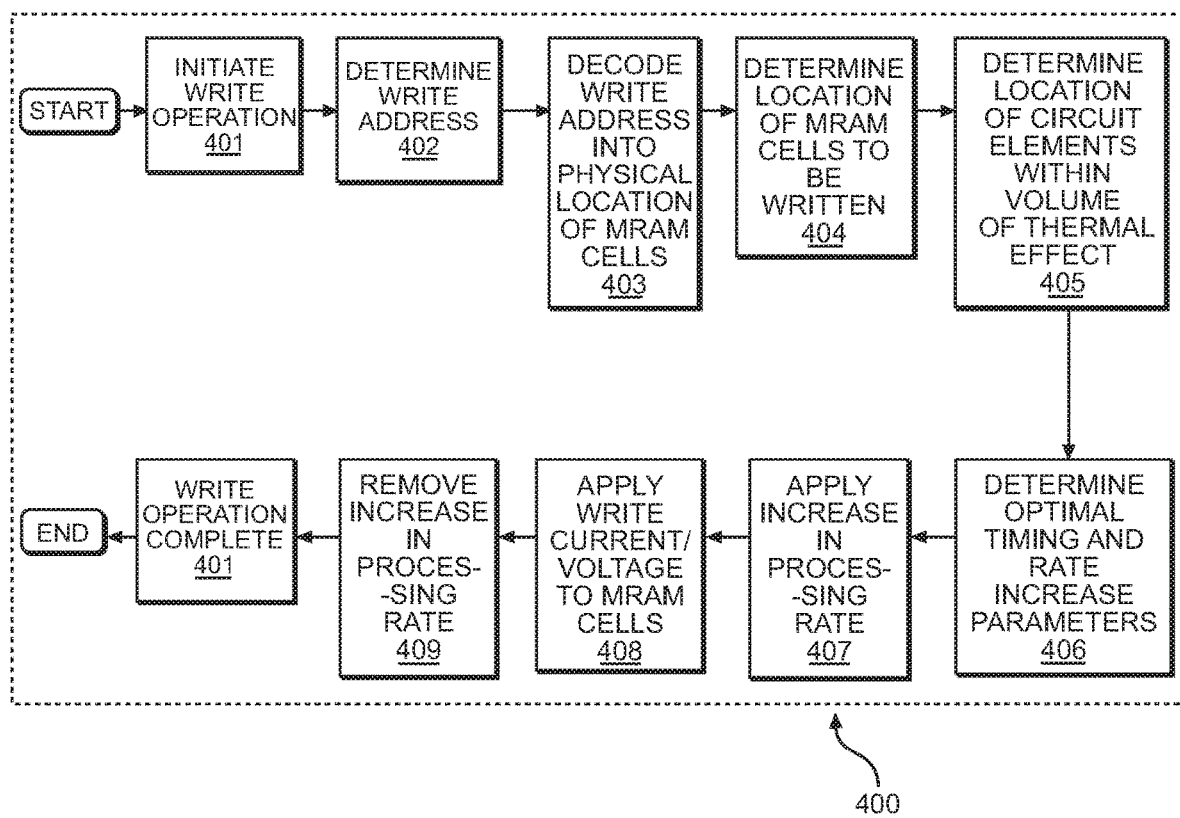
FIG. 4 illustrates a flow chart of a process of operations of an example controller during a write operation.

FIG. 4 illustrates a flow chart of a process 400 of operations of an example controller 206 during a write operation. The write operation is initiated at step 401. This step includes receiving a sequence of bits for writing. As an example, the sequence of bits can be received from a test script or be received as part of a computing workload. The process 400 moves to the step 402 where the controller 206 determines a write address or a plurality of write addresses for the sequence of bits. Next, in the step 403, the controller 206 decodes the write address information into physical locations of the MRAM cells 203 associated with the address information. In the next step 404, the controller 206 determines the location of the MRAM cells 203 subject to write operations. In an embodiment, the step 404 determines the cells that need to have their polarity changed to achieve the write operation. For instance, if a read operation is performed before the write operation, then the cells that are to be changed may be determined by comparing the read values to the desired write values and then switching polarity on the bits that are different. This can reduce the power and write time to perform the write operation because cells that already have the correct polarity would not be heated and/or switched. In another embodiment, in step 404, the controller 206 can perform a complete write operation on all the cells regardless of the prior magnetic state of the MRAM cells 203.

In an embodiment, the steps 403 and 404 can be implemented using a physical matrix layout of the MRAM cells 203 and the write and read circuits that connect them. For example, the controller 206 can scan a previously stored matrix layout of the MRAM cells 203 to determine physical locations of MRAM cells 203 subject to write operations for the sequence of bits. In the next step 405, the controller 206 determines the circuit elements 204 that are within a volume of thermal effect of the MRAM cells 203 determined in the step 404. The volume of thermal effect 205, and the circuit elements 204 therein, can be determined as described above in relation to the embodiment of FIG. 2. In one embodiment of the step 405, the controller 206 can be configured to determine circuit elements 204 within a volume of thermal effect 205 by using information related to device layout, bus lines, and circuit connections of the circuit elements 204 and/or the circuit layer 202. Such information may be previously stored in a layout and connection file accessible by the controller 206. In another embodiment, the controller 206 can be configured to use control or bus-lines designed for accessing the circuit elements 204 during a write operation in order to provide heat to an MRAM cell 203 within a volume of thermal effect 205.

In the step 406, the controller 206 determines optimal timing parameters and the optimal amount of processing increase desired for circuit elements 204 identified in the step 405. Determining optimal timing parameters can include determining the timing of increase in processing rate for the circuit elements identified in the step 405. The timing can be determined in time steps or increments as may be applicable to the circuit elements 204 and can include information such as clock rates, number of time steps prior to or after the end of write operations to begin or end the increase in processing rates of the circuit elements 204, applicable clock rate to use, and other optimization factors. In an embodiment, the optimal timing parameters can be determined empirically using various methods. For example, during an initialization procedure, the processing rates and timing parameters can be modified while performing multiple write operations. The read and or write error rates can be monitored during this process to select the optimal parameters. In another embodiment of step 406, the controller 206 can empirically determine the optimal sequence and timing of rate increases for each circuit element 204. For instance, it can be more efficient to perform the write operation on some MRAM cells prior to others because of their location and or time to reach the desired temperature which in turn prescribes the timing of rate increase of the circuit elements 204 within the volume of thermal effect 205.

In some embodiments, the controller 206 can be configured to modulate the processing rates of the circuit elements 204 according to a timing schedule. The timing schedule can be predetermined and coded in the controller 206, where the controller 206 increases the processing rates of the circuit elements 204 a fixed time period before the end of write operations in a nearby MRAM cell 203. The fixed time period can be based on a variety of factors including the desired degree of temperature increase. In some embodiments, the fixed time period can be empirically determined. In some embodiments, the timing of increased processing rate can continue past the end of write operations for an MRAM cell 203. In other embodiments, where heat retention in the MRAM cells 203 is appreciable, the increase in processing rates can be removed a period of time before end of write operations to provide the benefits described above, while conserving energy.

In some embodiments, the timing schedule of increasing processing rates can be dynamically determined based on a variety of factors including availability of workloads for processing in the circuit elements 204, the distribution of processing across the circuit elements 204, one or more dynamically-adjusted thermal maps and other dynamic methods as may be envisioned by persons of ordinary skill in the art. In some embodiments, the timing schedule of increase in processing rates can be statistically determined. In other embodiments, the timing schedule can be stochastically-determined.

In the next step 407, the controller 206 applies the increase in processing rate to the circuit elements 204 identified in the step 405 and within the timing parameters determined in the step 406. In the he next step 408, the controller 206 applies the write currents and/or voltages to the MRAM cells 203 identified in the steps 403/404, and thus sets the magnetic direction of the free layer of those cells according to the applied field created by the applied write currents and/or voltages. In the step 409, the introduced increase in the processing rate of the circuit elements 204 can be removed according to the timing parameters determined in the step 406. The write operation is complete at the step 410.

What is claimed is:
1. A system, comprising:
an MRAM structure, comprising a plurality of MRAM cells;
a plurality of circuit elements, each configured to process one or more computing tasks at a processing rate;
a controller configured to:
determine MRAM cells subject to upcoming write operations;
determine one or more circuit elements, in the plurality of circuit elements and within a volume of thermal effect relative to the MRAM cells subject to write operations; and
increase processing rate of the one or more circuit elements within the volume of thermal effect.
2. The system of claim 1, wherein the volume of thermal effect comprises a volume surrounding the MRAM cells subject to upcoming write operations, wherein thermal response of circuit elements within the volume of thermal effect influences thermal response of the MRAM cells within the volume of thermal effect.
3. The system of claim 1, wherein the controller is further configured to increase the processing rate of the one or more circuit elements within the volume of thermal effect during write operations, or for a period of time starting before end of write operations, or from a predetermined period of time before end of write operations to a predetermined time after end of write operations.
4. The system of claim 1, wherein the controller is further configured to increase the processing rate, one or more time steps before end of the write operations, wherein the one or more time steps are determined at least partly based on a predetermined time period, a dynamically-determined time period, a stochastically-determined time period, or a combination thereof.

5. The system of claim 1, wherein the plurality of circuit elements comprise one or more of ALUs, control units, processor cores, registers, transistors, wire drivers, amplifiers, decoders, buses, gates, diodes, inverters and converters.

6. The system of claim 1, wherein the volume of thermal effect comprises a cube of dimension of approximately 500 micrometers per side and centered around the MRAM cells subject to upcoming write operations.

7. The system of claim 1, wherein the increase in processing rate is in an amount, such that thermal response of the one or more circuit elements within the volume of thermal effect, contributes to improving performance of write operations of the MRAM cells within the volume of thermal effect.

8. The system of claim 1, wherein the MRAM structure comprises two-terminal MRAM, three-terminal MRAM, STT-MRAM, SOT-MRAM, two-terminal STT-MRAM, two-terminal SOT-MRAM, three-terminal STT-MRAM and three-terminal SOT-MRAM.

9. The system of claim 1, wherein the MRAM cells are in a back-end-of-line (BEOL) metal layer and the one or more circuit elements within the volume of thermal effect comprise transistors in a layer underneath the BEOL layer.

10. The system of claim 1, wherein the MRAM structure is part of a three-dimensional integrated circuit and the one or more circuit elements within the volume of thermal effect comprise transistors located along a vertical axis relative to the MRAM cells within the volume of thermal effect.

11. The system of claim 1 further comprising one or more microheaters within the volume of thermal effect and wherein the increase in processing rate is in an amount such that heat generated from the one or more microheaters and heat generated in the one or more circuit elements within the volume of thermal effect in combination improve write performance of the MRAM cells within the volume of thermal effect.

12. A method comprising:
determining MRAM cells subject to upcoming write operations;
determining a volume of thermal effect relative to the MRAM cells subject to write operations;
determining one or more circuit elements within the volume of thermal effect; and
increasing processing rate of the one or more circuit elements within the volume of thermal effect.

13. The method of claim 12, wherein the volume of thermal effect comprises a volume surrounding the MRAM cells subject to upcoming write operations, wherein thermal response of circuit elements within the volume of thermal effect influences thermal response of the MRAM cells within the volume of thermal effect.

14. The method of claim 12, wherein increasing the processing rate of the one or more circuit elements within the volume of thermal effect occurs during write operations, or occurs for a period of time starting before end of write operations, or occurs from a predetermined period of time before end of write operations to a predetermined time after end of write operations.

15. The method of claim 12, wherein increasing the processing rate occurs one or more time steps before end of the write operations, wherein the one or more time steps are determined at least partly based on a predetermined time period, a dynamically-determined time period, a stochastically-determined time period, or a combination thereof.

16. The method of claim 12, wherein increasing processing rate is in an amount, such that thermal response of the one or more circuit elements within the volume of thermal effect, contributes to improving performance of write operations of the MRAM cells within the volume of thermal effect.

17. The method of claim 12, wherein the MRAM cells are part of an MRAM structure comprising two-terminal MRAM, three-terminal MRAM, STT-MRAM, SOT-MRAM, two-terminal STT-MRAM, two-terminal SOT-MRAM, three-terminal STT-MRAM and three-terminal SOT-MRAM.

18. The method of claim 12, wherein the MRAM cells are in a back-end-of-line (BEOL) metal layer and the one or more circuit elements within the volume of thermal effect comprise transistors in a layer underneath the BEOL layer.

19. The method of claim 12, wherein the MRAM cells are part of a three-dimensional integrated circuit and the one or more circuit elements within the volume of thermal effect comprise transistors positioned along a vertical axis relative to the MRAM cells within the volume of thermal effect.

20. The method of claim 12, further comprising operating one or more microheaters within the volume of thermal effect and wherein the increase in processing rate is in an amount such that heat generated from the one or more microheaters and heat generated in the one or more circuit elements within the volume of thermal effect in combination improve write performance of MRAM cells within the volume of thermal effect.

* * * * *